United States Patent [19]
Hagen et al.

[11] Patent Number: 5,763,322
[45] Date of Patent: Jun. 9, 1998

[54] METHOD OF ANNEALING FILM STACKS AND DEVICE HAVING STACK PRODUCED BY SAME

[75] Inventors: Kenneth Hagen, Meridian; Howard E. Rhodes, Boise, both of Id.

[73] Assignee: Micron Technology, Inc., Boise, Id.

[21] Appl. No.: 676,593

[22] Filed: Jul. 8, 1996

[51] Int. Cl.⁶ .................. H01L 21/4763; H01L 21/31; H01L 21/469
[52] U.S. Cl. .................. 438/632; 438/760
[58] Field of Search .................. 438/632, 661, 438/760, 799

[56] References Cited

U.S. PATENT DOCUMENTS 5,387,557  2/1995  Takagi .................. 438/760

*Primary Examiner*—Brian Dutton
*Attorney, Agent, or Firm*—Mueting, Raasch & Gebhardt, P.A.

[57] ABSTRACT

An annealing method includes providing a wafer having a film stack including at least a flowable film and a semirigid film formed on the flowable film. The film stack is exposed to an initial temperature followed by exposure to an intermediate temperature for an intermediate exposure time period. Then, the film stack is exposed to a final anneal temperature for a final anneal exposure time period. The film stack may include another nonflowable or flowable film formed on the semirigid film. The film stack may be exposed to one or more additional intermediate temperatures for additional intermediate exposure time periods. The film stack may be an oxide/polysilicon/oxide film stack and the oxide films may be doped oxides. A device or wafer having a film stack annealed in accordance with the annealing method is also provided.

30 Claims, 2 Drawing Sheets

METHOD OF ANNEALING FILM STACKS AND DEVICE HAVING STACK PRODUCED BY SAME

FIELD OF THE INVENTION

The present invention relates to the fabrication of semiconductor devices. More particularly, the present invention pertains to methods of annealing film stacks in the fabrication of semiconductor devices and devices having such annealed stacks.

BACKGROUND OF THE INVENTION

In the fabrication or processing of semiconductor devices, film stacks are utilized for various functions. For example, an oxide film/polysilicon film/oxide film stack may be utilized for insulating fabricated devices from each other and metal interconnection layers. Further, for example, other flowable film/semirigid film/flowable film stacks are used to isolate one conductive layer from another conductive layer and to accomplish planarization.

With the use of such film stacks, an annealing process which subjects the film stacks to high temperatures is beneficial. More particularly, the longer the film stack is exposed to the high temperatures, the more beneficial the annealing process becomes. Such high temperature annealing processes are useful for densification of the films, for example, so as to stabilize etch rates during subsequent dry or wet etch processes. Further, such high temperatures provide for reflow of various films so as to perform planarization.

Known annealing processes typically subject the film stacks to temperatures of about 800° C. for a relatively short time period, for example, 10 minutes, after being positioned in a heating unit. The heating unit is at a somewhat lower temperature when the wafers are positioned in the unit and the temperature is then ramped to the final anneal temperature of about 800° C. Typically, the annealing process is performed by either conventional furnace processing or rapid thermal processing (RTP). In furnace processing, the temperature is ramped from the initial temperature to the final anneal temperature relatively slowly as compared to the transition rates using RTP annealing. However, with RTP, higher temperatures may be required.

However, high temperature annealing of film stacks, whether by RTP or furnace processing, for relatively long periods of time, gives rise to film buckling or wrinkling. Buckling or wrinkling of the film stacks may cause various problems in the semiconductor device being fabricated. For example, film buckling may cause stress in a lower lying film potentially causing reliability issues associated with increased leakage such as when the lower lying film is a thin nitride film. Further, such stress in lower lying films may cause the underlying film to crack.

Such buckling and wrinkling not only causes problems associated with the underlying layers, but also may cause problems with overlying layers. For example, the buckling or wrinkling may cause patterning or photolithography problems in the overlying films. Such patterning or photolithography problems may lead to shorts or opens in the devices fabricated as a result of the buckling of the film stacks.

For the above reasons, there is a need in the art to achieve high temperature annealing of film stacks over relatively longer time periods. Such annealing methods must maintain the benefits of the annealing process while eliminating the buckling or wrinkling effects common with the use of current film stack annealing processes. The present invention as described below overcomes the problems described above and other problems which will become apparent to one skilled in the art from the description below.

SUMMARY OF THE INVENTION

An annealing method in accordance with the present invention includes providing a wafer having a film stack including at least a flowable film and a semirigid film formed on the flowable film. The film stack is exposed to an initial temperature followed by exposure to an intermediate temperature for an intermediate exposure time period. Then, the film stack is exposed to a final anneal temperature for a final anneal exposure time period.

In one embodiment of this method, the film stack may include another nonflowable or flowable film formed on the semirigid film. In further embodiments of this method, the film stack may be an oxide/polysilicon/oxide film stack and the oxide films may be doped oxides. In yet another embodiment of this method, the film stack may be exposed to one or more additional intermediate temperatures for additional intermediate exposure time periods. Moreover, a device or wafer having a film stack annealed in accordance with this annealing method is also provided.

In another annealing method in accordance with the present invention, the method includes providing a wafer having a film stack including a flowable film, a semirigid film formed on the flowable film, and either a nonflowable or flowable film formed on the semirigid film. The film stack is exposed to an initial temperature, followed by exposing the film stack to an intermediate temperature for an intermediate exposure time period. Then, the film stack is exposed to a final anneal temperature for a final anneal exposure time period.

In one embodiment, the annealing method further includes exposing the film stack to one or more additional intermediate temperatures for additional intermediate exposure time periods. In further embodiments, each additional intermediate temperature may be of a temperature higher than the previous intermediate temperature.

In further embodiments, the annealing method includes using either rapid thermal processing or furnace processing for performing the exposure steps.

In another embodiment, the provision of the film stack includes providing a first oxide film, forming a polysilicon film on the first oxide film, and forming a second oxide film on the polysilicon film. Further with regard to this embodiment, the first oxide film may be a film flowable by thermal processing and the provision of the first oxide layer includes thermal processing of the wafer prior to the forming of the polysilicon film. Further with regard to this embodiment, the first oxide film may be a doped oxide film or both the first oxide film and the second oxide film may be doped oxide films.

In yet another embodiment, the invention includes a device or wafer having a film stack annealed in accordance with the annealing method of the present invention.

DESCRIPTION OF THE PREFERRED EMBODIMENTS

Figure 1:
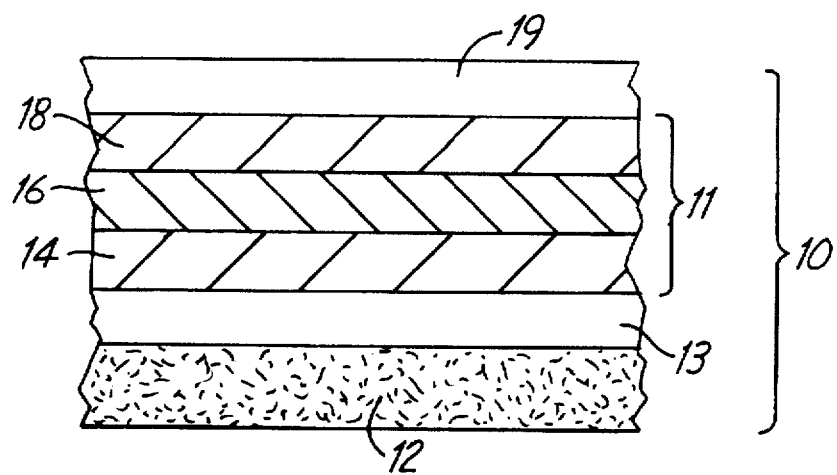
FIG. 1 is a cross-sectional view of a portion of a wafer illustrating a film stack in accordance with the present invention.
Figure 2:
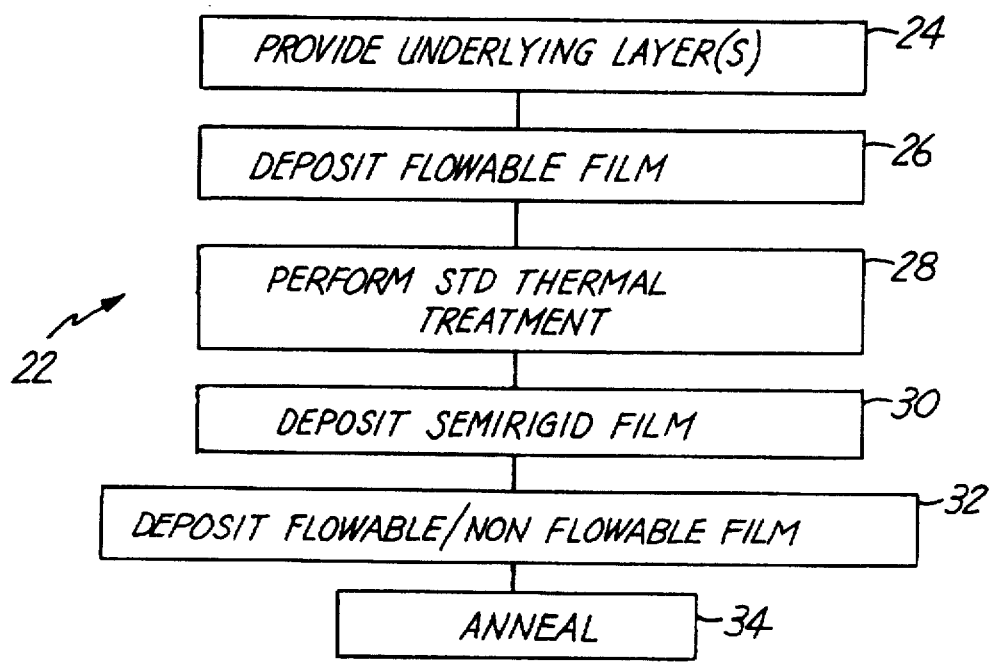
FIG. 2 is a general flow diagram of a process of forming a film stack using an annealing process in accordance with the present invention.
Figure 3:
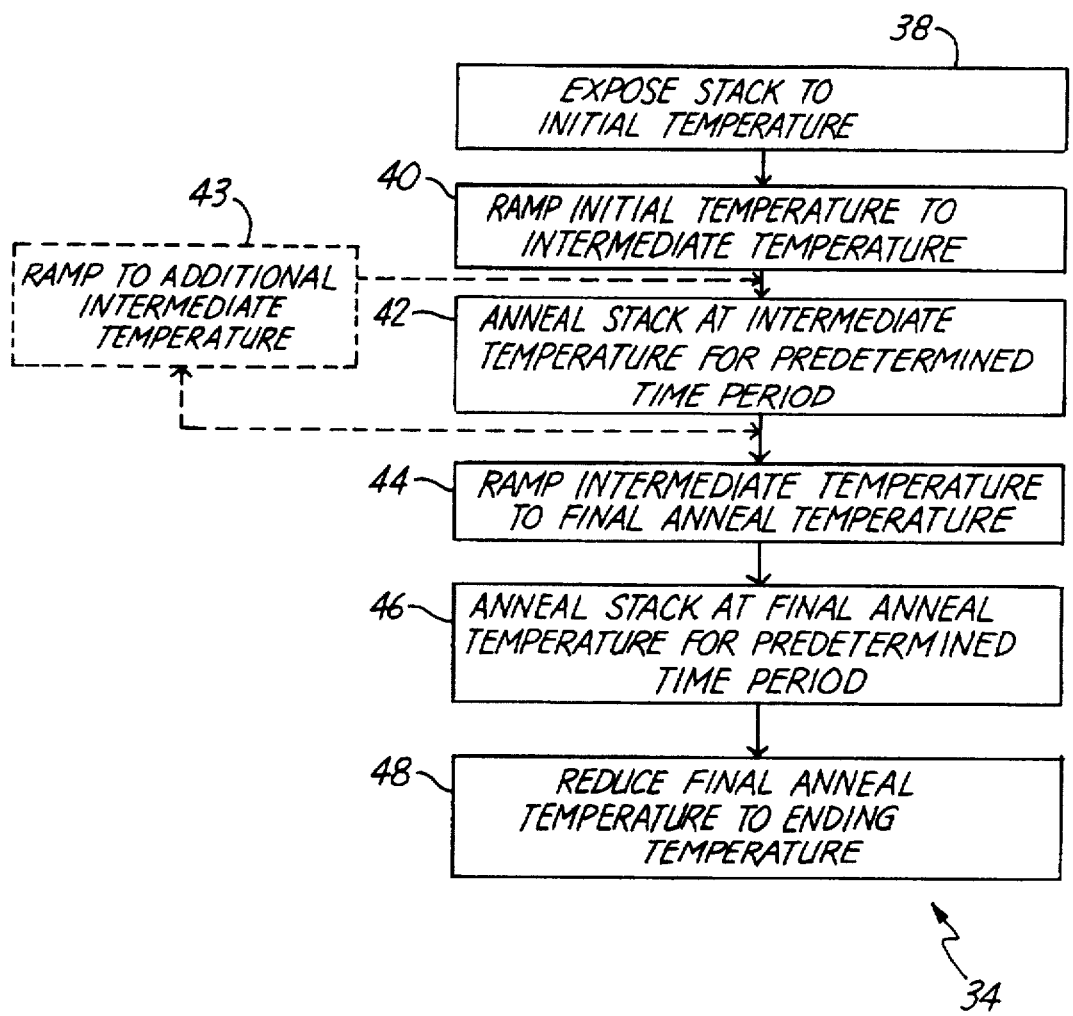
FIG. 3 is a general flow diagram of the final annealing process (block 34) of FIG. 2 in accordance with the present invention.

The method and film stack in accordance with the present invention shall be described with reference to FIGS. 1–3. The annealing method 34 described herein with reference to FIGS. 1–3 is beneficial for annealing film stacks. Particularly, the annealing method 34 is beneficial for eliminating the buckling or wrinkling of film stacks when subjected to high temperature annealing processes performed for a relatively long period of time while maintaining the benefits of annealing such as densification and planarization. More particularly, the annealing method 34 utilizes intermediate annealing steps, such as intermediate annealing steps 40–44 (FIG. 3) that permit the wafer and film stack thereof to be annealed at annealing temperatures in the range of about 700° C. to about 1100° C. for periods of time without buckling or wrinkling of the film stack. For example, such annealing may include annealing for 3 hours at lower temperatures in this range, or may include annealing for at least 60 minutes at temperatures of about 800° C. This annealing method 34 will be described in detail below and further shown in the Examples that follow.

FIG. 1 is an illustrative cross-sectional view of a portion of a wafer 10 including a film stack 11 formed on an underlying layer or layers 13 and above substrate 12 and having an overlying layer or layers 19 formed thereon. The film stack 11 includes a flowable film 14, a semirigid film 16, and another film 18, which may be either a flowable or nonflowable (semirigid) film. The annealing method 34 in accordance with the present invention reduces the likelihood of damage occurring to the underlying layer or layers or processing problems when forming the overlying layer or layers, such as those described in the Background of the Invention section herein, when the wafer 10 and film stack 11 thereof are subjected to the high temperatures over relatively long periods of time to achieve the benefits of the annealing process. Such time periods are relatively long when compared to annealing time periods of current annealing methods of film stacks.

The underlying layer or layers may be any layer or film utilized in the processing of semiconductor devices. For example, the underlying layer or layers may be a thin silicon nitride layer, any metalization layer, doped silicon, polysilicon, or any other layer requiring insulation from another layer or film or any other layer that would benefit from a film stack being formed thereover.

The overlying layer or layers may also be any layer or film utilized in the processing of semiconductor devices. For example, the overlying film may be a metalization layer such as aluminum patterned over the film stack 11, or any other conductive material used for metalization such as titanium or silicides. Such overlying layer or layers may further include a spin on glass or a polyimide. Moreover, the overlying layer or layers may be virtually any film utilized in the fabrication of semiconductor devices including any of the flowable, nonflowable or semirigid films described herein. The method and film stack of the present invention contemplates the use of any overlying and underlying films that would benefit from use of the annealing method in accordance with the present invention and such films are not limited to those illustrative films described herein but only as described in the accompanying claims.

The film stack 11 includes flowable film 14. Suitable flowable films may include any flowable glasses which reflow at higher temperatures to provide a more planar and smoother surface. Further, such flowable films may include, for example, flowable oxide films, doped oxides such as borophosphosilicate glass (BPSG), phosphosilicate glass (PSG), borosilicate glass (BSG), and spin on glasses (SOGs). Such flowable films can be generally characterized in that the films can be reflowed to cover steps, fill gaps, and generally provide planar surfaces upon such reflow and will flow at temperatures less than about 1150° C. Generally, the thickness of such films is in the range of about 500 Å to about 40k Å. Preferably, the flowable films include the flowable doped oxides, and more preferably, the flowable film is a BPSG film.

Suitable semirigid films 16 usable in the film stack may include polysilicon, refractory metals such as tungsten, silicon nitride, silicides, undoped oxides such as TEOS, or any other semirigid film, such as conducting films, utilized in film stacks, and particularly those that would be utilized in a film stack between two oxide layers. Such semirigid films can be generally characterized in that the films can withstand annealing temperatures without degradation. Further, such semirigid films require a higher temperature to flow as compared to the flowable films. Generally, the thickness of such semirigid films is in the range of about 25 Å to about 10k Å. Preferably, the semirigid film includes polysilicon, silicon nitride, and tungsten and more preferably, the semirigid film is a polysilicon film.

Suitable films for film 18, which may include flowable or nonflowable (semirigid) films, include any of the flowable films described above with respect to flowable film 14 including, for example, flowable oxide films, doped oxides such as BPSG, PSG, and BSG, and SOGs. Further, film 18 may include films such as the films described above with respect to semirigid film 16, for example, undoped oxides such as TEOS films, refractory metals such as tungsten, silicon nitride, and suicides. Generally, the thickness of such films 18 are in the range of about 25 Å to about 40k Å. Preferably, the film 18 includes one of any flowable doped oxides, and more preferably, the flowable film is a BPSG film.

Preferably, the film stack 11 includes a flowable film, semirigid film, and another flowable film. More preferably, the film stack 11 includes a doped oxide/polysilicon/doped oxide film stack, and most preferably, the film stack 11 includes a BPSG/polysilicon/BPSG film stack.

The film stacks 11 described above all include three films. However, as would be recognized by one skilled in the art, the annealing process described herein may also be utilized with two film stacks, or stacks that would not include film 18. Such stacks would include a flowable film deposited on an underlying layer or layers and then a semirigid film deposited on the flowable film. The flowable film deposited may include any of the flowable films previously described and the semirigid film may include any of the semirigid films previously described. For example, the two film stack may include a doped oxide film and a silicide, for example, BPSG and tungsten silicide, such as in the case of a buried bit line.

FIG. 2 provides a flow diagram for illustrating the general process of forming and annealing a film stack 11. The process 22 includes the steps of providing an underlying layer or layers 13 as represented by block 24, depositing a flowable film 14 as represented by block 26, and then performing a standard thermal treatment for reflowing the flowable film 14 as represented by block 28. The process 22 further includes depositing a semirigid film 16 as represented by block 30, depositing a flowable or nonflowable film 18 as represented by block 32 and then performing the annealing process for the film stack 11 as represented generally by block 34 and in more detail in FIG. 3. A similar process would be used for forming and annealing a two film stack, except that block 32 would not be performed.

The underlying layer or layers 13 provided as represented in block 24, may include any one or more of the underlying films described previously above. Further, the process for forming the underlying layer or layers 13 may be any process known to those skilled in the art for forming such a layer and may be performed in any number of processing steps. The present invention is in no manner limited to any particular underlying layer or layers but is limited only in accordance with the invention as described in the accompanying claims.

The flowable film 14 deposited may include any of the flowable films described previously above and further may be deposited or formed with any appropriate process for forming the film as would be known to one skilled in the art. Preferably, the flowable film 14 deposited is a doped oxide film, and more preferably any BPSG film. The BPSG film, for example, may have but is not limited to about 1–5% weight boron and about 3–9% weight phosphorous.

The flowable film 14 may be deposited using any conventional chemical vapor deposition (CVD) techniques, such as, for example, low pressure CVD (LPCVD) or plasma enhanced CVD (PECVD), as are commonly known to those skilled in the art. For example, the BPSG film may be deposited at a temperature typically as low as 400° C. and at atmospheric pressure by oxidizing silane with oxygen, with the addition of diborane and phosphine in sufficient amounts to co-deposit the desired amounts of $SiO_2$, phosphorous pentoxides ($P_2O_5$) and boron trioxide ($B_2O_3$) as well as interbonded Si, P, and B oxide species as is known to one skilled in the art.

After the flowable film 14 is deposited, the film is caused to flow and generally obtains a substantially planarized state by thermal exposure utilizing RTP or furnace thermal processing steps. For example, the BPSG film deposited may be exposed to temperatures of about 600° C. to about 1000° C. in a furnace process or may be exposed to temperatures of about 900° C. to about 1150° C. using RTP. Preferably, the standard RTP processing and furnace thermal steps for the BPSG film includes exposure to temperatures of about 800° C. to about 950° C. in a furnace process or exposed to temperatures of about 900° C. to about 1100° C. using RTP.

After the flowable film 14 has been thermally treated as represented in block 28, the semirigid film 16 is deposited. The semirigid film 16 deposited may include any of the semirigid films described above or other appropriate semirigid films and further may be deposited or formed with any appropriate process for forming the film as would be known to one skilled in the art. Preferably, the semirigid film deposited is a patterned thin polysilicon film. The polysilicon film may be doped or undoped.

The semirigid film 16 is preferably deposited using conventional chemical vapor deposition (CVD) techniques, such as, for example, LPCVD or PECVD, as are commonly known to those skilled in the art. For example, the polysilicon film may be deposited at low pressure in the range of about 0.2 to 1.0 torr at a rate of 10–120 nm/min by the decomposition of silane at a temperature typically of about 500° C. to about 650° C.

After the semirigid film 16 is deposited, the film 18 of the stack 11 is deposited as represented by block 32. The film 18 may be any of the flowable or nonflowable films as described previously, may be the same or different from one of the flowable films 14 described previously, and may be deposited by a same or a different process than is used for deposition of the flowable films 14. Preferably, the film 18 is an oxide film, and more preferably is substantially the same as the first oxide film 14, which is preferably BPSG. Further, the film 18 is preferably deposited in substantially the same manner as described above with respect to the BPSG film.

Following the deposition of the film 18, the stack 11 is annealed using the annealing process 34 of the present invention as is represented by block 34 of FIG. 2 and which is shown in more detail in the general flow diagram of FIG. 3. The annealing method 34 includes the steps of exposing the wafer 10 and the film stack 11 thereof to an initial starting temperature as represented by block 38. The initial temperature is then ramped to an intermediate temperature as is represented by block 40 followed by the annealing of the wafer 10 and film stack 11 thereof for a predetermined time period as represented by block 42. The intermediate temperature is then ramped once again to a final anneal temperature as represented by block 44 and the wafer 10 and film stack thereof is annealed at the final anneal temperature for a predetermined time period as represented by block 46. The wafer 10 and film stack 1 1 thereof is then cooled by discontinuing the heating process and allowing the stack to cool to an ending temperature as represented by block 48, typically, for example, to the push temperature of the furnace when the wafers are positioned therein.

The annealing method 34 can be performed by using either RTP or furnace processing techniques. During RTP, lower temperatures are ramped to higher temperatures very rapidly, and then after being held at such elevated temperatures, the temperatures are brought rapidly back to the lower temperatures. Typically, temperature transition rates for RTP range from 10° C./sec to 350° C./sec, compared to transition rates of about 0.01° C./sec to about 0.25° C./sec for conventional furnace processing. Hold times at the elevated temperatures for RTP are also relatively short compared to furnace processing. For example, hold times may be in the range of 1 second to 5 minutes as compared to furnace processing having hold times in the range of about 1 min to about 3 hours. Further, other thermal processing units are available and others may become available in the future which perform the thermal processing at levels between those of RTP and standard furnace processing. As a result, the temperature ranges, transition rates, and hold times described herein have been described generally to encompass such thermal processing units. The thermal processing units used to perform the annealing method utilizing intermediate steps in accordance with the present invention may include any of the above described techniques, and the ranges, rates, hold times, and other conditions of the anneal process, as stated above, are described generally to encompass such methods.

The initial temperature to which the wafer and film stack thereof is exposed is generally the push temperature of the furnace when wafers are positioned therein. The initial temperature may be in the temperature range of room temperature to about 750° C. More preferably, the initial temperature is in the temperature range of about 500° C. to about 700° C., such as for a BPSG film/polysilicon film/ BPSG film stack using furnace processing. This initial temperature would typically be about room temperature or about 20° C., for example, when using RTP.

The ramping of the initial temperature to the intermediate temperature (block 40) is performed at a rate in a range of about 0.01° C./sec to about 350° C./sec. For RTP, the rate would be at the upper portion of this transition rate range and for furnace processing, the rate would be at the lower portion of this transition rate range. More preferably, ramping of the initial temperature to the intermediate temperature is performed at a rate in the range of about 1° C./min to about 15° C./min for an oxide/polysilicon/oxide film stack when using furnace processing, preferably where the oxides are doped oxides such as, for example, BPSG.

The intermediate temperature is preferably in the range of about 550° C. to about 1° C. below the final anneal temperature as described below. More preferably, the intermediate temperature is in the temperature range of about 650° C. to about 5° C. below the final anneal temperature, such as for an oxide/polysilicon/oxide film stack, preferably where the oxides are doped oxides such as, for example, BPSG.

The wafer 10 and film stack 11 thereof is then annealed at the intermediate temperature for a time period in the range of about 1 second to about 3 hours at an intermediate temperature in the range given above. For RTP, the hold time would be at the lower portion of this time range and for furnace processing, the hold time would be at the upper portion of this time range. More preferably, the anneal time period at the intermediate temperature is in the range of about 10 seconds to about 1 hour at an intermediate temperature in the range given above, such as for an oxide/polysilicon/oxide film stack, preferably where the oxides are doped oxides, such as, for example, BPSG.

Optionally, as represented by dashed block 43 of FIG. 3, the first intermediate temperature can be ramped to additional intermediate temperatures and then annealed for additional intermediate time periods. For example, the additional intermediate temperatures may be in the same ranges described above for the first intermediate temperature, but each subsequent additional intermediate temperature utilized would be higher than the previous intermediate temperature. The hold time ranges described above for performing the anneal at the intermediate temperatures are equally applicable to the additional intermediate temperature anneal hold times.

As would be apparent to one skilled in the art, the annealing method 34 may include any number of additional intermediate temperatures and additional intermediate exposure time periods. Each additional intermediate temperature may be at a temperature higher or lower than the previous intermediate temperature. For example, if three intermediate temperatures were utilized, the second temperature may be lower or higher than the first temperature and the third temperature may be lower or higher than the first or second temperature. However, preferably, each additional intermediate temperature is at a temperature higher than the previous temperature.

In addition, one skilled in the art would recognize that although the intermediate temperatures preferably fall within the range of 550° C. to 1° C. below the final anneal temperature, the intermediate temperatures may fall within the range of 550° C. to the upper limit of the final anneal temperatures at 1100° C. For example, in a two intermediate temperature anneal process, the first intermediate temperature may be 700° C. which is less than the fmal anneal temperature of 800° C. and the second anneal temperature may be 810° C. which is higher than the final anneal temperature of 800° C.

Moreover, it is possible that with use of a single intermediate step, that the intermediate temperature is less than the push or initial temperature. For example, if the initial or push temperature is 700° C., the intermediate step could be performed at 690° C. and still provide benefit for lengthening the final anneal-duration.

As described above, there are various temperature alternatives available for the intermediate step or steps and the present invention is not limited to any particular temperatures. It is the use of an intermediate temperature, whether higher or lower than the previous temperature, held for a time period falling within the ranges described herein, that provides benefit when performing the anneal at the final anneal temperature. As would be readily apparent, the ramping between temperatures may either be ramping the temperature lower or ramping the temperature higher depending upon the subsequent temperature to be utilized.

The ramping of the intermediate temperature to the final anneal temperature is performed at a transition rate in the range of 0.01° C./sec to about 350° C./sec. For RTP, the rate would be at the upper portion of this transition rate range and for furnace processing, the rate would be at the lower portion of this transition rate range. More preferably, ramping of the intermediate temperature to the final anneal temperature is performed at a rate in the range of about 1° C./min to about 15° C./min for an oxide/polysilicon/oxide film stack, more preferably where the oxides are doped oxides such as BPSG.

The final anneal temperature may be in the range of about 700° C. to about 1100° C. For RTP, the temperature would be at the upper portion of this temperature range and for furnace processing, the temperature would be at the lower or middle portion of this temperature range. More preferably, the final anneal temperature is in the temperature range of about 700° C. to about 1000° C., such as for an oxide/polysilicon/oxide film stack, preferably where the oxides are doped oxides such as, for example, BPSG.

The wafer 10 and film stack 11 thereof is annealed at the final anneal temperature for a time period in the range of about 1 second to about 3 hours at a final anneal temperature in the range given above. For RTP, the hold time would be at the lower portion of this time range and for furnace processing, the hold time would be at the upper or middle portion of this time range. The final anneal time period, as described below with regard to the examples that follow, has been accomplished for at least 45 minutes at 800° C. using a single intermediate step and for at least 60 minutes using a two intermediate step process at 800° C. for a BPSG/polysilicon/BPSG film stack using furnace processing.

After the final anneal is completed, the final anneal temperature is reduced to an ending temperature by discontinuing the heating process and allowing the stack to cool to an ending temperature, typically, for example, to the push temperature of the furnace when the wafers are positioned therein.

FIG. 1 shows a wafer having a stacked film annealed in accordance with the annealing method of the present invention. As would be apparent to one skilled in the art, the wafer may include any number of fabricated semiconductor devices having a stacked film, and the present invention is not limited to any particular fabricated wafer but only to a fabricated wafer or device thereof incorporating a film stack as annealed in accordance with the present invention.

The following examples show use of the annealing method in accordance with the present invention; maintaining the benefits of the annealing process while eliminating the buckling or wrinkling of stacked films.

EXAMPLE 1

This Example 1 uses a film stack annealing process as described with reference to FIG. 3 utilizing a single intermediate annealing step. A BPSG layer is deposited on a silicon substrate using a CVD deposition by oxidizing silane with oxygen at a temperature of about 400° C. and atmospheric pressure. The deposition is performed with the addition of diborane and phosphine such that the BPSG layer includes about 3.8% weight of boron and about 6.9% weight of phosphorous. The thickness of the BPSG layer is about 6000 Å. The BPSG layer is reflowed using both a furnace thermal step and an RTP step. The furnace thermal step is performed for 30 minutes at 800° C. and the RTP step is performed for 20 seconds at 1000° C.

The polysilicon layer is an unpatterned polysilicon layer on the BPSG deposited by the decomposition of silane at a temperature of about 535° C. and pressure of about 200 mT. As this Example is performed with a worst case unpatterned polysilicon layer, its results can be extended to patterned polysilicon layers as well.

Another BPSG film is deposited on the unpatterned polysilicon in the same manner as the first BPSG layer and under the same conditions.

After the second BPSG layer is formed, the BPSG/polysilicon/BPSG film stack is annealed in a furnace anneal according to the following steps. The wafers were inserted into the furnace at a temperature of 650° C. The temperature is ramped to an intermediate anneal temperature of 700° C. at a transition rate of 5° C./min. The wafer is then annealed at 700° C. for 10 minutes. The temperature is then again ramped to a final anneal temperature of 800° C. at a transition rate of 7° C./min. The wafers are then annealed at the final anneal temperature of 800° C. for 45 minutes. No buckling or wrinkling is observed by the tester during this entire 45 minute period.

EXAMPLE 2

This Example 2 is substantially the same as Example 1, except that an intermediate temperature of 750° C. is utilized instead of the 700° C. temperature for the intermediate annealing step. Again, no wrinkling or buckling of the film is observed by the tester during the 45 minutes.

EXAMPLE 3

In this Example 3, the film stack is provided substantially as provided in Example 1: However, two intermediate annealing steps are performed instead of the one intermediate step as performed in both Examples 1 and 2. After the second BPSG layer was formed, the BPSG/polysilicon/BPSG film stack is annealed in a furnace anneal according to the following steps. The wafers are inserted into the furnace at a temperature of 650° C. The temperature is ramped to an intermediate anneal temperature of 700° C. at a transition rate of 5° C./min. The wafer is then annealed at 700° C. for 10 minutes. Then, the temperature is ramped to an additional intermediate anneal temperature of 750° C. at a transition rate of 5° C./min. The wafer is then annealed at 750° C. for 10 minutes. The temperature is then again ramped to a final anneal temperature of 800° C. at a transition rate of 5° C./min. The wafers are then annealed at the final anneal temperature of 800° C. for 60 minutes. No buckling or wrinkling is observed by the tester during this entire 60 minute period.

Although the invention has been described with particular reference to preferred embodiments thereof, variations and modifications of the present invention can be made within a contemplated scope of the following claims as is readily known to one skilled in the art.

What is claimed is:

1. An annealing method comprising the steps of:
   providing a wafer having a film stack including at least a flowable film and a semirigid film formed on the flowable film;
   exposing the film stack to an initial temperature;
   exposing the film stack to an intermediate temperature for an intermediate exposure time period; and
   exposing the film stack to a final anneal temperature for a final anneal exposure time period.

2. The annealing method according to claim 1, further including the step of exposing the film stack to one or more additional intermediate temperatures for additional intermediate exposure time periods.

3. The annealing method according to claim 2, wherein each additional intermediate temperature is of a temperature higher than the previous intermediate temperature.

4. The annealing method according to claim 1, wherein the film stack further includes one of a nonflowable or flowable film formed on the semirigid film.

5. The annealing method according to claim 4, wherein the film stack is an oxide/polysilicon/oxide film stack, and further wherein the intermediate temperature is in the range of about 550° C. to about 1100° C., the intermediate time period is in the range of about 10 seconds to about 60 minutes, the final anneal temperature is in the range of about 700° C. to 1100° C., and the final anneal exposure time period is in the range of about 10 seconds to about 3 hours.

6. The annealing method according to claim 5, further including the step of exposing the film stack to one or more additional intermediate temperatures for additional intermediate exposure time periods, wherein the one or more additional intermediate temperatures are in the range of about 550° C. to about 1100° C. and the additional intermediate exposure time periods are in the range of about 10 seconds to about 60 minutes.

7. The annealing method according to claim 1, wherein one or more of the exposing steps are performed using one of rapid thermal processing or furnace processing.

8. The annealing method according to claim 1, wherein the initial temperature is in a temperature range of about room temperature to about 750° C., the intermediate temperature is in a temperature range of about 550° C. to about 1100° C., and the final anneal temperature is in a temperature range of about 700° C. to about 1100° C.

9. The annealing method according to claim 1, wherein the final anneal exposure time period is greater than the intermediate exposure time period.

10. The annealing method according to claim 1, wherein the film stack is an oxide/silicide film stack, and further wherein the intermediate temperature is in the range of about 550° C. to about 1100° C., the intermediate time period is in the range of about 10 seconds to about 60 minutes, the final anneal temperature is in the range of about 700° C. to 1100° C., and the final anneal exposure time period is in the range of about 10 seconds to about 3 hours.

11. The annealing method according to claim 10, further including the step of exposing the film stack to one or more additional intermediate temperatures for additional intermediate exposure time periods, wherein the one or more additional intermediate temperatures are in the range of about 550° C. to about 1100° C. and the additional intermediate exposure time periods are in the range of about 10 seconds to about 60 minutes.

12. An annealing method comprising the steps of:
   providing a wafer having a film stack including:

a flowable film;

a semirigid film formed on the flowable film; and one of a nonflowable or flowable film formed on the semirigid film;

exposing the film stack to an initial temperature;

exposing the film stack to an intermediate temperature for an intermediate exposure time period; and exposing the film stack to a final anneal temperature for a final anneal exposure time period.

13. The annealing method according to claim 12, further including the step of exposing the film stack to one or more additional intermediate temperatures for additional intermediate exposure time periods.

14. The annealing method according to claim 13, wherein each additional intermediate temperature is of a temperature higher than the previous intermediate temperature.

15. The annealing method according to claim 14, wherein the film stack is a doped oxide/polysilicon/doped oxide film stack, and further wherein the intermediate temperature is in the range of about 550° C. to about 1100° C., the intermediate time period is in the range of about 10 seconds to about 60 minutes, the one or more additional intermediate temperatures are in the range of about 550° to about 1100° C., and the one or more additional intermediate time periods are in the range of about 10 seconds to about 60 minutes.

16. The annealing method according to claim 15, wherein the method includes one additional intermediate temperature and additional time period, and further wherein the intermediate temperature is about 700° C., the intermediate time period is about 10 minutes, the additional intermediate temperature is about 750° C., and the additional intermediate time period is about 10 minutes.

17. The annealing method according to claim 13, wherein the final anneal exposure time period is at least 60 minutes.

18. The annealing method according to claim 12, wherein one or more of the exposing steps are performed using one of rapid thermal processing or furnace processing.

19. The annealing method according to claim 18, wherein the performance of the one or more exposing steps includes the step of ramping the temperature from one exposure step to the temperature of the next exposure step at a rate in a range of about 0.01° C./sec to about 200° C./sec.

20. The annealing method according to claim 12, wherein the initial temperature is in a temperature range of about room temperature to about 750° C., the intermediate temperature is in a temperature range of about 550° C. to about 1100° C., and the final anneal temperature is in a temperature range of about 700° C. to about 1100° C.

21. The annealing method according to claim 20, wherein the intermediate exposure time period is in a range of about 10 seconds to about 60 minutes.

22. The annealing method according to claim 20, wherein the final anneal exposure time period is in a range of about 10 seconds to about 3 hours.

23. An annealing method comprising the steps of:

providing a wafer having a film stack including:

a first oxide film;

a polysilicon film formed on the first oxide film; and a second oxide film formed on the polysilicon film; and exposing the film stack to an initial temperature;

exposing the film stack to an intermediate temperature for an intermediate exposure time period; and exposing the film stack to a final anneal temperature higher than the initial temperature for a final anneal exposure time period.

24. The annealing method according claim 23, wherein at least the first oxide film is a film flowable by thermal processing and further wherein the providing of the first oxide layer includes thermal processing of the wafer prior to the forming of the polysilicon film.

25. The annealing method according claim 24, wherein at least the first oxide film is a doped oxide film.

26. The annealing method according claim 25, wherein the first oxide film and the second oxide film are doped oxide films.

27. The annealing method according to claim 23, wherein one or more of the exposing steps are performed using one of rapid thermal processing or furnace processing.

28. The annealing method according to claim 27, wherein the performance of the one or more exposing steps includes the step of ramping the temperature from one exposure step to the temperature of the next exposure step at a rate in a range of about 0.01° C./sec to about 200° C./sec.

29. The annealing method according to claim 23, wherein the initial temperature is in a temperature range of about 500° C. to about 700° C., the intermediate temperature is in a temperature range of about 650° C. to about 5° C. below the final anneal temperature, and the final anneal temperature is in a temperature range of about 700° C. to about 1000° C.

30. The annealing method according to claim 29, wherein the intermediate exposure time period is in a range of about 5 minutes to about 30 minutes and wherein the final anneal exposure time period is in a range of about 10 seconds to about 3 hours.

* * * * *

UNITED STATES PATENT AND TRADEMARK OFFICE
CERTIFICATE OF CORRECTION

PATENT NO.: 5,763,322
DATED: June 9, 1998
INVENTOR(S): Hagen et al.

It is certified that error appears in the above-identified patent and that said Letters Patent is hereby corrected as shown below:

Col. 7, line 61, delete "fmal" and insert --final--; and

Column 12, line 16, delete "fmal" and insert --final--.

Signed and Sealed this

Eighth Day of May, 2001

*Attest:*

NICHOLAS P. GODICI

*Attesting Officer*   Acting Director of the United States Patent and Trademark Office